(12) United States Patent
Li

(10) Patent No.: US 6,956,291 B1
(45) Date of Patent: Oct. 18, 2005

(54) APPARATUS AND METHOD FOR FORMING SOLDER SEALS FOR SEMICONDUCTOR FLIP CHIP PACKAGES

(75) Inventor: Felix C. Li, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 106 days.

(21) Appl. No.: 10/346,416

(22) Filed: Jan. 16, 2003

(51) Int. Cl.[7] .............................................. H01L 23/52
(52) U.S. Cl. ...................................... 257/778; 257/738
(58) Field of Search ................................ 257/620, 630, 257/772, 773, 40, 41, 737, 738, 741, 778–780, 257/782–783, 786; 438/106, 125, 114, 108

(56) References Cited

U.S. PATENT DOCUMENTS

| | | | | |
|---|---|---|---|---|
| 4,446,475 A | * | 5/1984 | Gercekci et al. ................ 257/48 |
| 5,448,014 A | * | 9/1995 | Kong et al. ................. 174/52.3 |
| 5,523,628 A | * | 6/1996 | Williams et al. ............. 257/777 |
| 5,701,008 A | * | 12/1997 | Ray et al. ..................... 250/352 |
| 5,739,546 A | * | 4/1998 | Saitou et al. .................. 257/48 |
| 5,897,336 A | * | 4/1999 | Brouillette et al. .......... 438/108 |
| 6,062,461 A | * | 5/2000 | Sparks et al. ............. 228/123.1 |
| 6,245,595 B1 | | 6/2001 | Nguyen et al. |
| 6,287,895 B1 | * | 9/2001 | Sato ............................ 438/114 |
| 6,316,786 B1 | * | 11/2001 | Mueller et al. ................ 257/40 |
| 6,329,671 B1 | * | 12/2001 | Tamaki et al. ................ 257/48 |
| 6,352,881 B1 | | 3/2002 | Nguyen et al. |
| 6,376,915 B1 | * | 4/2002 | Hikita et al. ................ 257/777 |
| 6,400,033 B1 | * | 6/2002 | Darveaux ................... 257/778 |
| 6,404,040 B1 | * | 6/2002 | Hikita et al. ................ 257/630 |
| 6,498,422 B1 | * | 12/2002 | Hori ........................... 310/344 |
| 6,663,227 B2 | * | 12/2003 | Yamamoto et al. ........... 347/59 |
| 6,677,187 B2 | * | 1/2004 | Salaville ..................... 438/125 |
| 6,777,263 B1 | * | 8/2004 | Gan et al. ................... 438/106 |
| 2004/0032009 A1 | * | 2/2004 | Fang et al. ................. 257/620 |
| 2004/0100164 A1 | * | 5/2004 | Murata et al. .............. 310/348 |
| 2004/0113215 A1 | * | 6/2004 | Shimada et al. ............ 257/414 |

OTHER PUBLICATIONS

Nguyen et al., U.S. Appl. No. 10/080,913 filed Feb. 21, 2002, "Method and Apparatus for Forming an Underfill Adhesive Layer".

* cited by examiner

Primary Examiner—Ha Nguyen
Assistant Examiner—Andre' C. Stevenson
(74) Attorney, Agent, or Firm—Beyer Weaver & Thomas LLP

(57) ABSTRACT

An apparatus and method for forming a substantially continuous solder bump around the periphery of each dice on a flip chip wafer is disclosed. The solder bump is provided on each die so that when it is singulated from the wafer and mounted onto a substrate, the solder bump around the periphery acts to hermetically attach and seal the die to the substrate. According to various embodiments of the invention, the continuous solder bump may be coupled to either a ground plane or a power supply on the substrate. The method includes fabricating a plurality of integrated circuit dice on a first surface of a semiconductor wafer. After the integrated circuitry is fabricated, a substantially continuous solder bump is formed on the periphery of each of the dice on the wafer.

7 Claims, 4 Drawing Sheets

APPARATUS AND METHOD FOR FORMING SOLDER SEALS FOR SEMICONDUCTOR FLIP CHIP PACKAGES

FIELD OF THE INVENTION

The present invention relates generally to a wafer level packaging process for surface mounted flip chip integrated circuits. More particularly, the invention relates to apparatus and methods for forming wafer level solder bump around the periphery of each die on a flip chip wafer so that when the individual die are singulated from the wafer and mounted onto a substrate, the solder bump acts to hermetically attach and seal the flip chip to the substrate.

BACKGROUND OF THE INVENTION

There are a number of conventional processes for packaging surface mounted integrated circuits. One approach is commonly referred to as "flip chip" packaging which generally contemplates the forming of solder bump contacts (or other suitable contacts) directly on an integrated circuit die on a wafer. After the contacts are formed, the dice are singulated by sawing or cutting the wafer along the scribe lines. The individual die are then "flipped" and surface mounted or attached to a substrate, such as a printed circuit board. That is, the solder bumps on the die are aligned and mounted onto matching contacts on the substrate. The solder bumps are then reflowed to electro-mechanically connect the die to the substrate.

When a flip chip die is mounted to the substrate, an air gap typically remains between the die and substrate. This gap is commonly filled with material that is flowed into the gap in liquid form and is then solidified. This material is generally a mixture of a epoxy resin and small silica spheres and is often called underfill. A dispenser or nozzle is typically used to dispense the liquid underfill material at one edge of the die. The material then flows into the narrow gap due to capillary action and spreads across the flip chip die until finally the entire area of the gap between the die and substrate is filled. The underfill material is then cured. For more details on the aforementioned type of package, see for example U.S. Pat. No. 6,245,595, and co-pending U.S. application Ser. No. 09/359,214 filed Jul. 22, 1999 and Ser. No. 10/080,913 filed Feb. 21, 2002, all assigned to the same assignee of the present application and incorporated by reference herein for all purposes.

There are problems associated with aforementioned type of underfill process. For example, the operation of applying underfill must be repeated for each flip chip mounted onto a substrate. Repeating such an operation many times during manufacturing significantly increases costs. Also, as the underfill material flows past solder bumps to fill the gap, separation of silica spheres from resin may occur. The occurs because some silica spheres may become trapped as they meet solder ball obstacles. The underfill material may therefore develop streaks of high and low silica concentration. The silica may also separate from the resin by sinking to one side of the gap, thus creating a silica rich side in the bottom and a resin rich side on the top of the gap. This segregation of silica and resin alters the mechanical properties of the filled region and thereby may mitigate the mechanical function of the underfill. The underfill material is also a generally poor heat conductor. The use of flip chips are therefore typically limited to relatively low power, slow speed applications. Also the mis-match of the coefficients of thermal expansion between the silicon, underfill, and substrate tends to create stresses on the solder that could lead to joint failure. Finally, after a flip chip has been surface mounted to a substrate, the underfill material makes part replacement or reworking very difficult.

An apparatus and method is therefore needed for forming a wafer level solder bump around the periphery of each die on a flip chip wafer so that when an individual die is singulated from the wafer and mounted onto a substrate, the solder bump acts to hermetically attach and seal the flip chip to the substrate.

SUMMARY OF THE INVENTION

To achieve the foregoing and other objects in accordance with the purpose of the present invention, an apparatus and method for forming a substantially continuous solder bump around the periphery of each dice on a flip chip wafer is disclosed. The solder bump is provided on each die so that when it is singulated from the wafer and mounted onto a substrate, the solder bump around the periphery acts to hermetically attach and seal the die to the substrate. According to various embodiments of the invention, the continuous solder bump may be coupled to either a ground plane or a power supply on the substrate. The method includes fabricating a plurality of integrated circuit dice on a first surface of a semiconductor wafer. After the integrated circuitry is fabricated, a substantially continuous solder bump is formed on the periphery of each of the dice on the wafer. In various embodiments, the continuous solder bumps are fabricated at substantially the same time as other signal pads on the wafer.

BRIEF DESCRIPTION OF THE DRAWINGS

The features of the present invention may best be understood by reference to the following description of the presently preferred embodiments together with the accompanying drawings. For the sake of clarity the drawings are not to scale.

DETAILED DESCRIPTION OF THE INVENTION

Figure 1:
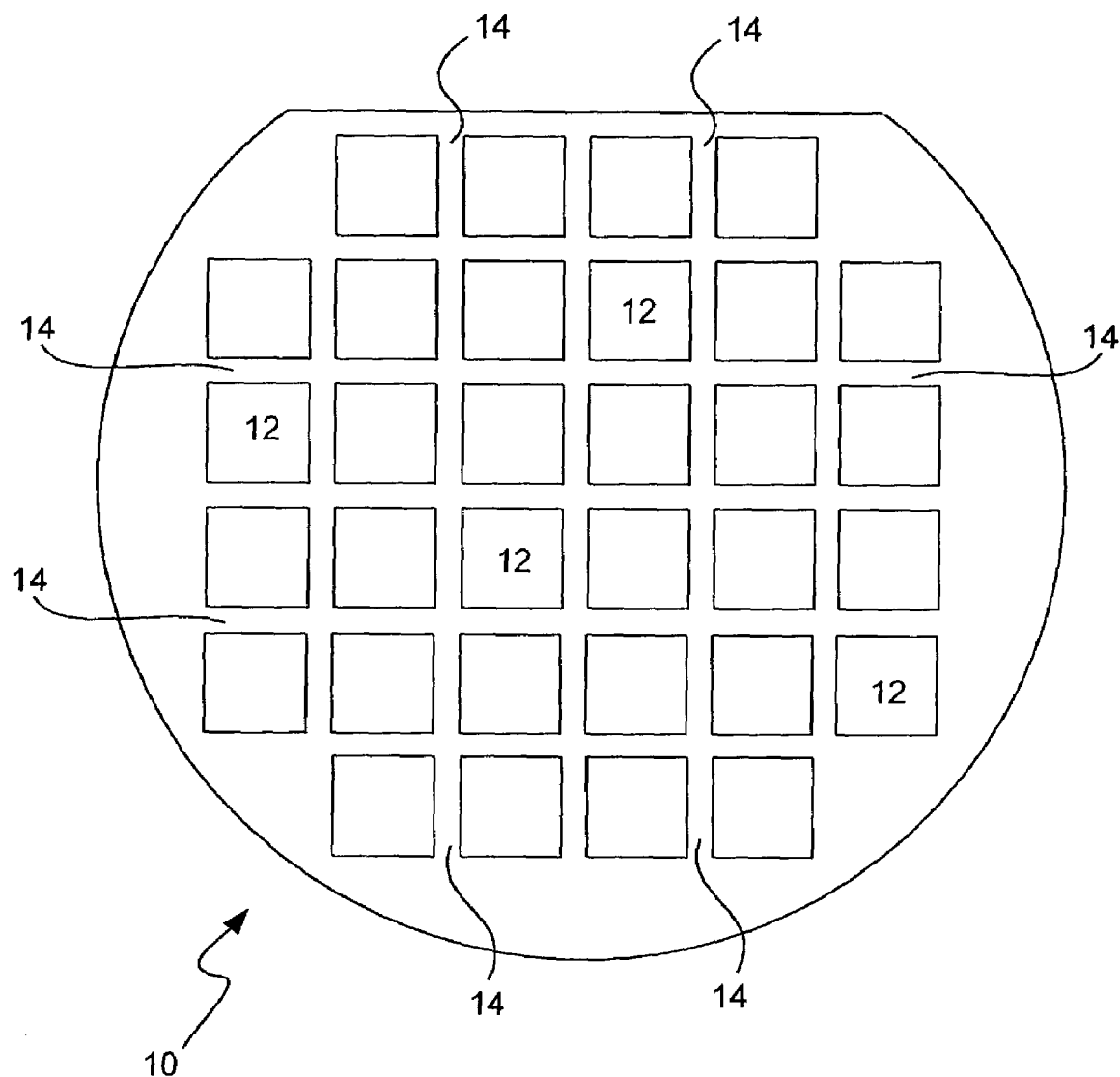
FIG. 1 is a semiconductor face mount "flip chip" wafer according to the present invention.

Referring to FIG. 1, a semiconductor wafer 10 with a plurality of integrated circuit surface mount or "flip chip" dice 12 fabricated thereon is shown. A plurality of horizontal and vertical scribe lines 14 (sometimes referred to in the semiconductor industry as "saw streets") are provided to separate the individual dice 12 on the wafer 10. After fabrication, the individual die 12 are singulated by cutting or sawing the wafer along the scribe lines 14.

Figure 2:
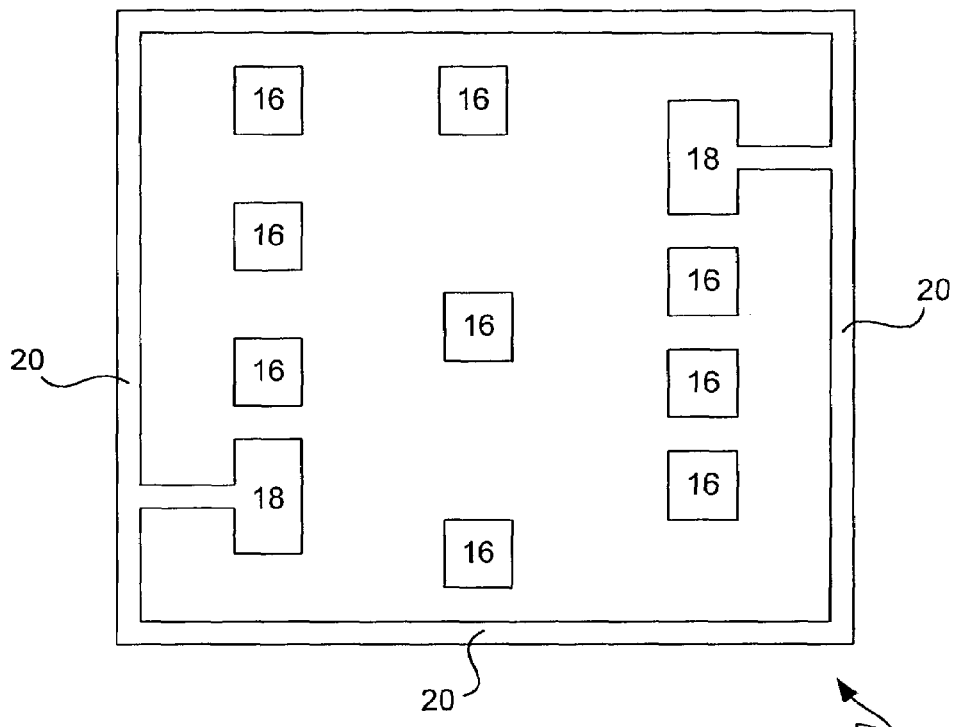
FIG. 2 is a top down view of an individual die scribed from the wafer of FIG. 1 according to the present invention.

Referring to FIG. 2, a top down view of an individual die 12 scribed from the wafer 10 is shown. The die 12 includes, among other features not shown for the sake of simplicity, a plurality of signal input/output solder pads 16. According to various embodiments of the invention, the input/output solder pads 16 can be either digital, analog, or a combination thereof. As is well known in the semiconductor art, the solder pads 16 provide input and/or output signals to digital circuitry, analog circuitry, or a combination thereof fabricated on the die 12. The die 12 also includes pads 18 that are coupled to a solder bump 20. Since the solder bump 20 forms a ring around the periphery of the die 12, it is adjacent the scribe lines 14 (not shown in this figure) that surround the die 12 on the wafer 10. In one embodiment, the solder bump 20 has a thickness ranging from 2 to 3 mils or less. It should be noted that as illustrated, the solder bump 20 is continuous around the entire periphery. In alternative embodiments, however, the solder bump 20 does not necessarily have to be continuous and can be periodically interrupted. In such embodiments, use of the underfill material may be desired or required. Thus the term "substantially continuous" as used herein is intended to broadly cover both the continuous and periodically interrupted embodiments.

Figure 3:
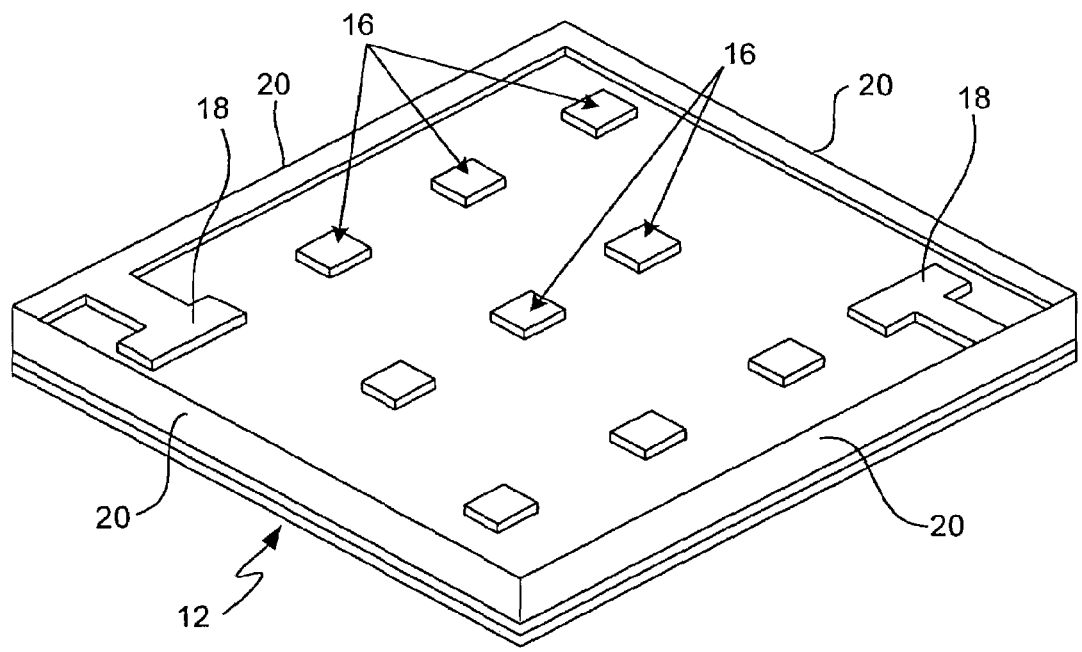
FIG. 3 is a perspective view of the individual die scribed from the wafer of FIG. 1 according to the present invention.

FIG. 3 is a perspective view of the die 12 according to the present invention. As is evident in this view, solder pads 16, 18 and the solder bump 20 are raised above the surface of the die. In various embodiments, solder pads 16, 18 and the solder bump 20 has a height ranging from 4 to 6 mil or less.

Figure 4:
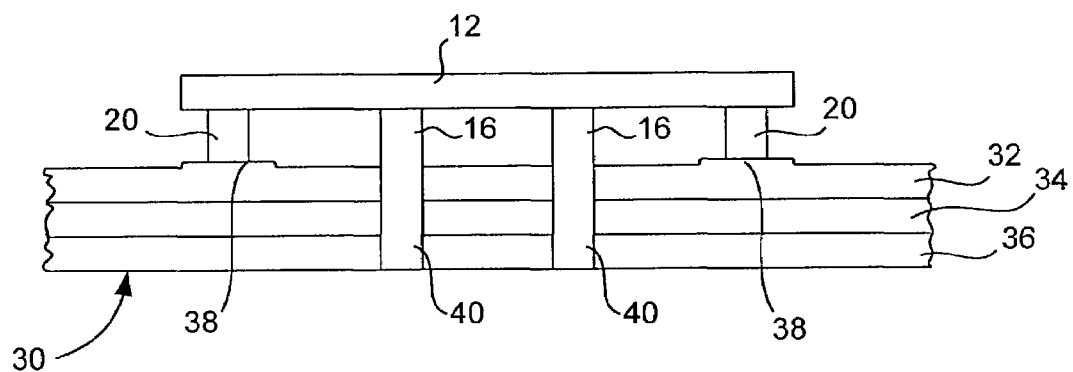
FIG. 4 is a cross section of a die scribed from the wafer of FIG. 1 hermetically sealed to a substrate according to one embodiment of the invention.

FIG. 4 is a cross section of a die 12 hermetically sealed to a substrate, such as a printed circuit board, according to one embodiment of the invention. The substrate 30 includes a power plane 32, a ground plane 34, and a signal plane 36. The die 12 is "flipped" so that the pads 16, 18 and the solder bump 20 face downward toward the surface of the substrate. During the attachment procedure, the die 12 is positioned so that the pads 16, 18 and solder bump 20 are aligned with mating contacts on the substrate. Thereafter, a solder reflow operation is performed. The reflow operation causes the solder of the pads 16, 18 and the solder bump 20 to reflow, causing an electromechanical joint to be formed between the die 12 and the substrate 30. With the embodiment shown in FIG. 4, contacts 38 are provided to electro-mechanically couple the solder bump 20 to the power plane 32. Vias 40 are used to couple the pads 16 to the signal plane 36 of the substrate 30. Since the solder bump 20 runs substantially continuous around the periphery of the die 12, a hermetic seal is formed between the die 12 and substrate 30 by the reflowed solder of bump 20. Beside providing the hermetic seal, the solder bump 20 also acts as a heat sink for dissipating heat generated by the die 12 during operation. The solder bump 20 also enables the die 12 to be readily removed from the substrate 30 after attachment. For example, if the die 12 fails in the field, it can be removed by applying sufficient heat to cause the solder of the bump 20 to reflow, allowing the die to be removed and replaced.

Figure 5:
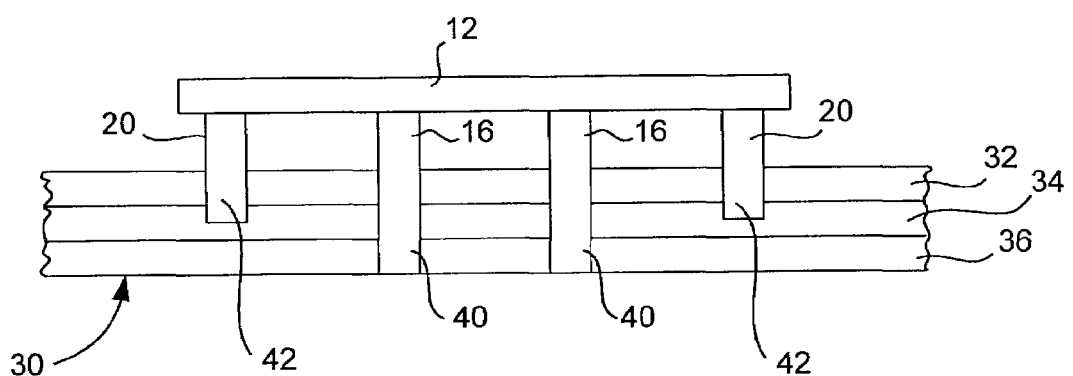
FIG. 5 is a cross section of a die scribed from the wafer of FIG. 1 and hermetically sealed to a substrate according to another embodiment of the invention.

FIG. 5 is a cross section of a surface mount flip chip die hermetically sealed to a substrate according to another embodiment of the invention. This embodiment is essentially the same as that illustrated with regard to FIG. 4, except the solder bump 20 is electro-mechanically coupled to the ground plane 34 through vias 42. Again, since the solder bump 20 runs substantially continuous around the periphery of the die 12, a hermetic seal is formed between the die 12 and substrate 30.

Figure 6:
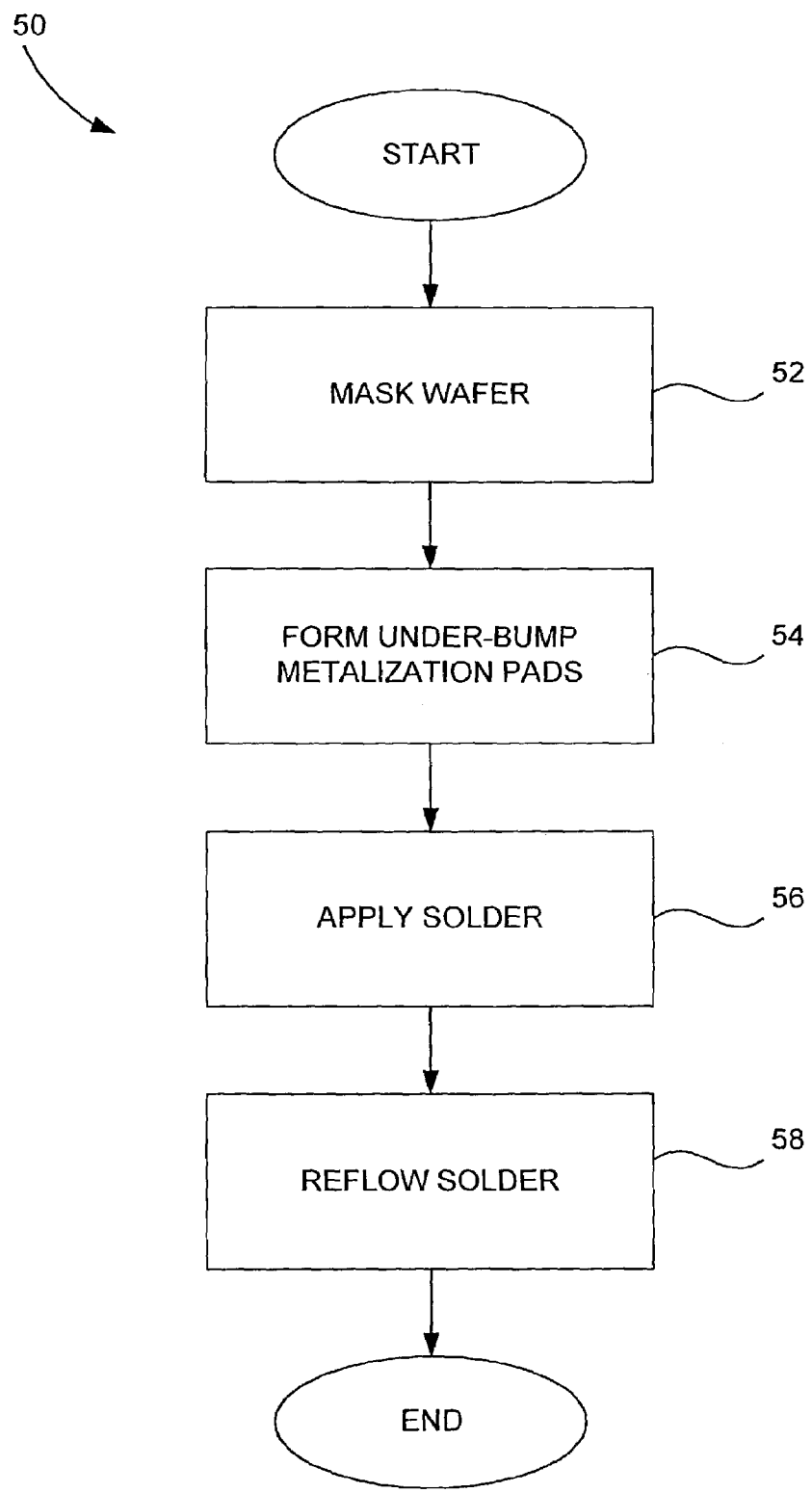
FIG. 6 is a flow chart that illustrates the fabrication steps for forming a substantially continuous solder bump on the periphery of dice on the wafer of FIG. 1 according to the present invention.

FIG. 6 is a flow chart 50 that illustrates the steps for fabricating the solder bump 20 according to one embodiment of the present invention. In the initial step 52, the wafer 10 is masked so that the regions where the solder bumps are to be formed are exposed. "Bowl" shaped under-bump metalization pads are formed on the exposed surfaces of the wafer (step 54). The under-bump metalization pads may be formed by a number of conventional processes. For example, a layer of solder or other conductive metal is applied on the surface of the wafer 10. The surface is then masked and etched, leaving the pads. In the next step 56, solder paste is applied onto the under-bump metalization pads. Thereafter, in step 58, the wafer 10 is heated causing the solder to reflow, causing the solder bump to assume a "half-dome" shape. It is useful to note that the "bowl-like" shape underbump metallization pad provides a barrier to the lateral flow of the solder paste during the reflow operation. It should also be noted that the aforementioned process is essentially the same as that used to form the solder contact pads 16 and 18. In one embodiment of the invention, the pads 16, 18 and the solder bump 20 can be formed at the same time. In alternative embodiments, the pads 16, 18 and the solder bumps can be formed at different times using different process steps.

Although only a few embodiments of the present invention have been described in detail, it should be understood that the present invention may be embodied in many other specific forms without departing from the spirit or scope of the invention. For example, the given dimensions of the solder bump 20 are provided only to illustrate and describe the invention with regard to one embodiment of the invention. In no way should these figures be construed as limiting. With further advancing in semiconductor process technology, it is expected that these dimensions will become smaller and smaller in the future. Therefore, the present examples are to be considered as illustrative and not restrictive, and the invention is not to be limited to the details given herein but may be modified within the scope of the appended claims.

What is claimed is:

1. An apparatus comprising:
   a semiconductor wafer;
   a plurality of dice fabricated on the semiconductor wafer, the individual die on the wafer being separated from one another by scribe lines; and
   a substantially continuous solder bump formed on the periphery of each of the dice on the semiconductor wafer, the substantially continuous solder bump having a width of three mils or less formed on the periphery of each of the die, the substantially continuous solder bump is configured to form a hermetic seal with a non-die substrate when the die is mounted to the substrate.

2. The apparatus of claim 1, wherein substantially continuous solder bump formed on the periphery of each of the dice ranges in height from 6 mils or less.

3. The apparatus of claim 1, wherein the substantially continuous solder bump formed on the periphery of each of the dice are formed adjacent the scribe lines that separate the dice on the semiconductor wafer.

4. An apparatus, comprising:
   a semiconductor die;
   integrated circuitry fabricated on the semiconductor die; and
   a substantially continuous solder bump formed on the periphery of the die, the substantially continuous solder bump having a width of three mils or less formed on the periphery of the die is configured to form a hermetic seal with a non-die substrate when the die is mounted to the substrate.

5. The apparatus of claim 4, wherein substantially continuous solder bump formed on the periphery of the die ranges in height from 6 mils or less.

6. The apparatus of claim 4, wherein the substantially continuous solder bump formed on the periphery of the die is configured to be in electrical contact with a ground plane on the substrate when the die is mounted to the substrate.

7. The apparatus of claim 4, wherein the substantially continuous solder bump formed on the periphery of the die is configured to be in electrical contact with a power supply provided on the substrate when the die is mounted to the substrate.

* * * * *